United States Patent
Nagarajan et al.

(10) Patent No.: US 6,806,119 B2
(45) Date of Patent: Oct. 19, 2004

(54) METHOD OF BALANCED COEFFICIENT OF THERMAL EXPANSION FOR FLIP CHIP BALL GRID ARRAY

(75) Inventors: Kumar Nagarajan, San Jose, CA (US); Zafer Kutlu, Menlo Park, CA (US); Shirish Shah, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/631,328

(22) Filed: Jul. 30, 2003

(65) Prior Publication Data

US 2004/0121519 A1 Jun. 24, 2004

Related U.S. Application Data

(62) Division of application No. 09/680,759, filed on Oct. 6, 2000, now Pat. No. 6,639,321.

(51) Int. Cl.[7] .............................................. H01L 21/44
(52) U.S. Cl. ...................................... 438/108; 438/106
(58) Field of Search .................................. 438/106, 108, 438/118; 257/735, 736

(56) References Cited

U.S. PATENT DOCUMENTS 6,335,571 B1 * 1/2002 Capote et al. .............. 257/787
6,441,499 B1 * 8/2002 Nagarajan et al. .......... 257/780

* cited by examiner

Primary Examiner—Van Thu Nguyen
Assistant Examiner—Brad Smith
(74) Attorney, Agent, or Firm—Fitch, Even, Tabin & Flannery

(57) ABSTRACT

A flip chip ball grid array package includes a thin die having a die thickness reduced from a wafer thickness to reduce mismatch of a coefficient of thermal expansion between the thin die and a substrate; a plurality of thin film layers formed on the thin die wherein each of the plurality of thin film layers has a coefficient of thermal expansion that is greater than that of the thin die and is less than that of the substrate; and a plurality of wafer bumps formed on the thin die for making electrical contact between the thin die and the substrate.

9 Claims, 3 Drawing Sheets

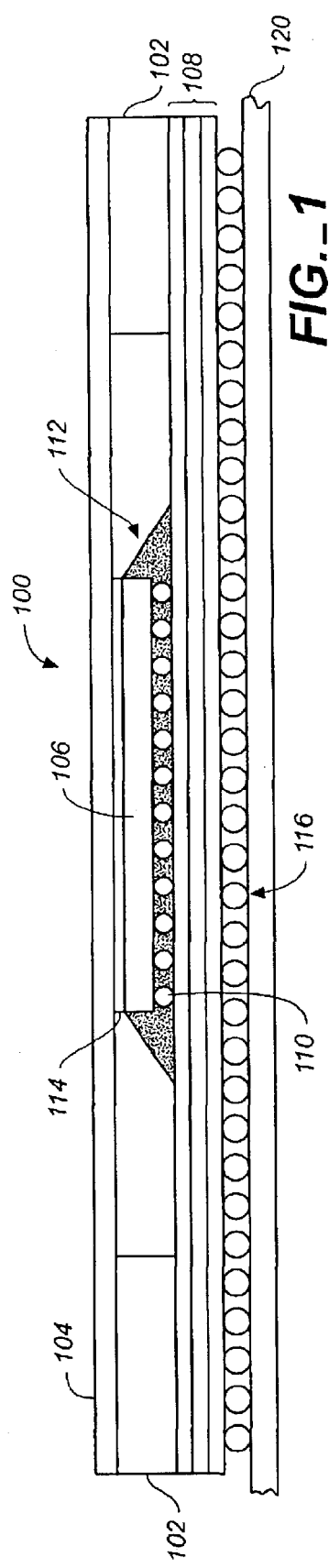
FIG._1
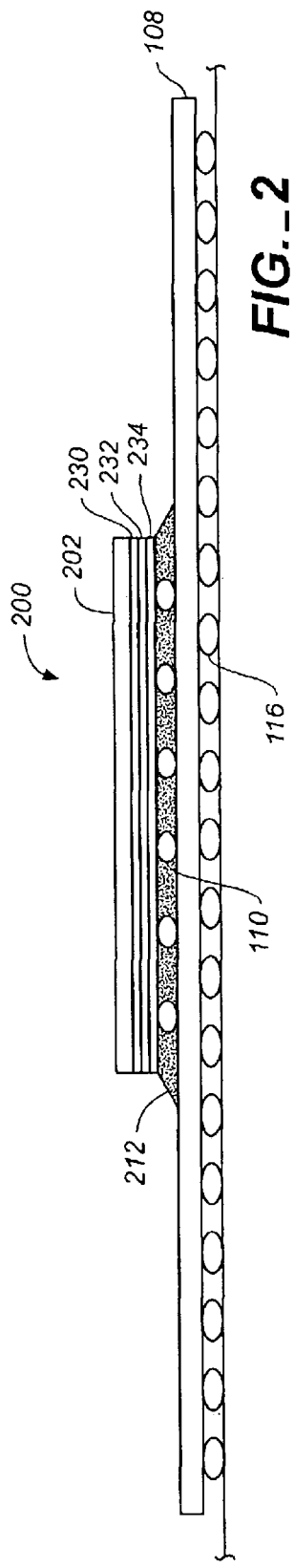
FIG._2
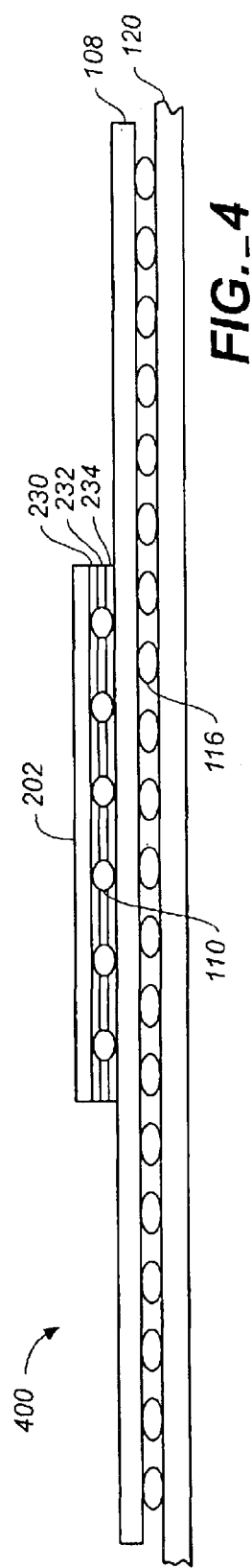
FIG._4

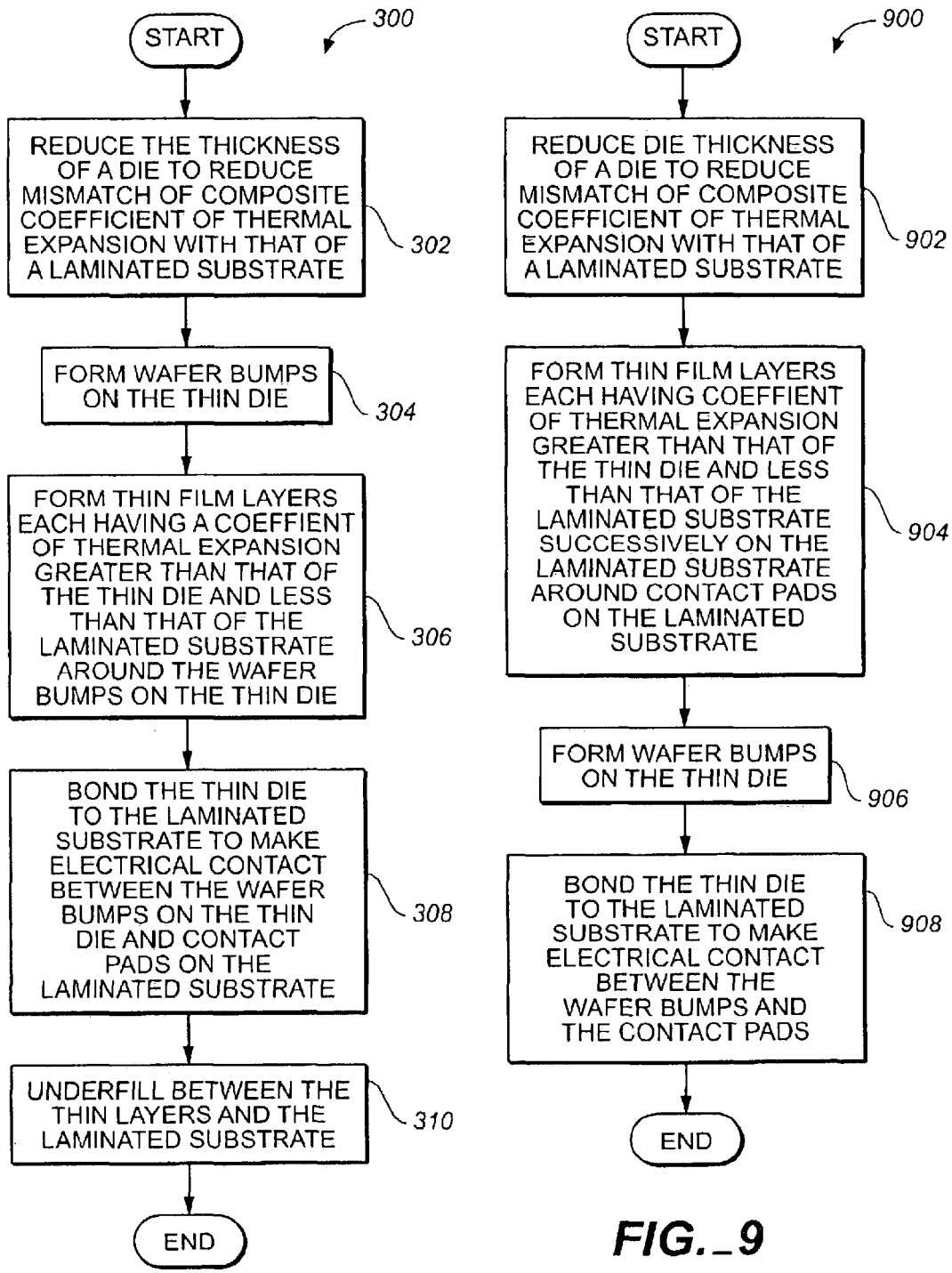
FIG._3
FIG._9

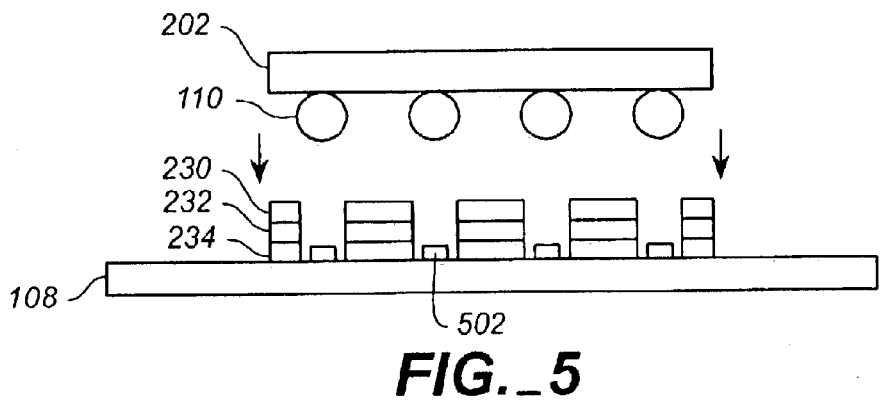
FIG._5
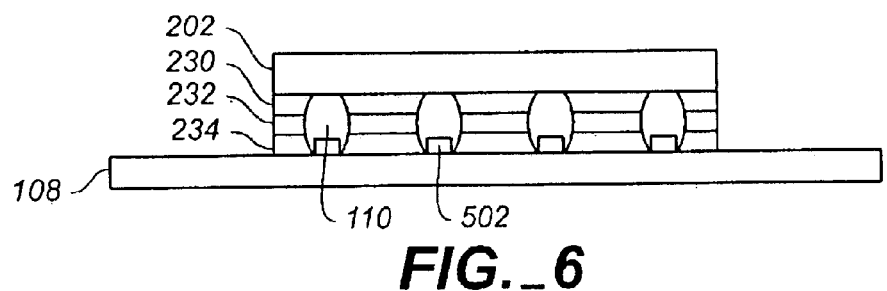
FIG._6
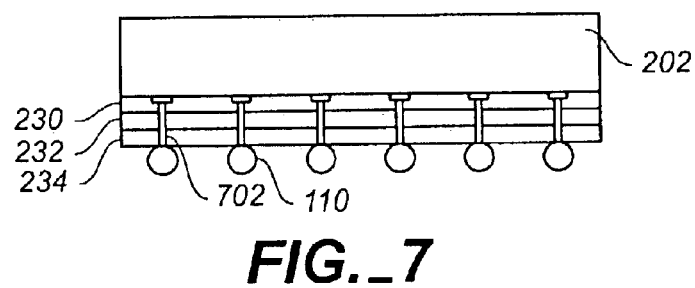
FIG._7
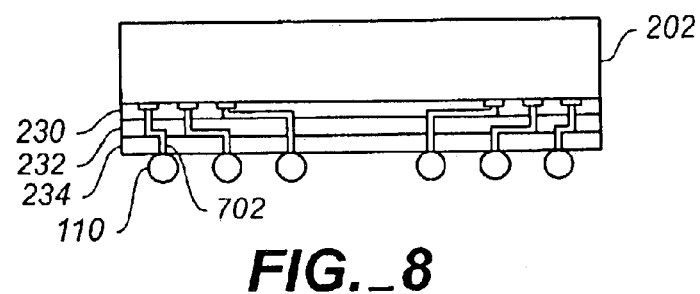
FIG._8

METHOD OF BALANCED COEFFICIENT OF THERMAL EXPANSION FOR FLIP CHIP BALL GRID ARRAY

CROSS REFERENCE TO RELATED APPLICATIONS

This is a Divisional Application of U.S. patent application Ser. No. 09/680,759. for BALANCED COEFFICIENT OF THERMAL EXPANSION FOR FLIP CHIP BALL GRID ARRAY, filed Oct. 6, 2000, by Nagarajan, et al., now U.S. Pat. No. 6,639,321.

BACKGROUND OF THE INVENTION

The present invention relates generally to package construction of integrated circuits. More specifically, but without limitation thereto, the present invention relates to the construction of an integrated circuit package for a flip chip ball grid array (BGA).

FIG. 1 is a side view diagram of a typical flip chip ball grid array package 100 of the prior art. Shown are a stiffener 102, a heat spreader 104, a die 106, a laminated substrate 108, wafer bumps 110, an underfill 112, a thermally conductive layer 114, solder balls 116, and a second level package 120.

In traditional flip chip package design, the die 106 has a standard thickness of 725 microns and is electrically connected to the laminated substrate 108 by the wafer bumps 110, which are typically made of a eutectic solder. The spaces between the wafer bumps 110 are filled with an adhesive underfill 112 after bonding the die 106 to absorb stresses on the die 106 due to a mismatch in the coefficient of thermal expansion (CTE) between the die 106 and the laminated substrate 108. The underfill 112 is typically an epoxy material that flows and fills the gap between the laminated substrate 108 by capillary action, and is cured after filling the gaps between the wafer bumps 110.

The stiffener 102 and the heat spreader 104 typically have the same area as the flip chip plastic ball grid array package 100. The stiffener 102 is attached to the substrate 108 to protect the flip chip ball grid array package 100 from flexure damage. The heatspreader 104 is attached to the stiffener 102 to conduct heat away from the die 106 through the thermally conductive layer 114. The flip chip ball grid array package 100 is mounted on the second level package 120 by the solder balls 116. The solder balls 116 have a typical width of about 610 microns, while the wafer bumps 110 have a typical width of only about 89 microns.

There are several problems and disadvantages with this approach, for example, inherent mismatch of the coefficient of thermal expansion of the die 106 (typically about 3.5 parts per million per degree Kelvin) with that of the laminated substrate 108 (typically about 16 parts per million per degree Kelvin) and poor adhesion between the adhesive underfill 112 and the passivation. The passivation is a thin film coating on the active side of the die 106 to protect the circuits on the die 106 from the environment. Typical passivation coatings are SiNx, polyamide, and BCB. The mismatch of the coefficient of thermal expansion and the poor adhesion leads to delamination of the die 106 from the underfill 112 and subsequent cracking of the wafer bumps 110. Filling the small gaps between the wafer bumps 110 with the underfill 112 also becomes increasingly difficult due to packaging using increasingly smaller bump pitch. As the bump pitch becomes smaller, air bubbles are introduced in the underfill 112 that propagate cracks in the wafer bumps 110. Further, there may be flux contamination that leads to the delamination of the underfill 112.

SUMMARY OF THE INVENTION

The present invention advantageously addresses the needs above as well as other needs by providing a method for making a flip chip ball grid array (BGA) package that reduces mismatch of a coefficient of thermal expansion (CTE).

In one embodiment, the invention may be characterized as a flip chip ball grid array package that includes a thin die having a die thickness reduced from a wafer thickness to reduce mismatch of a coefficient of thermal expansion between the thin die and a substrate; a plurality of thin film layers formed on the thin die wherein each of the plurality of thin film layers has a coefficient of thermal expansion that is greater than that of the thin die and is less than that of the substrate; and a plurality of wafer bumps formed on the thin die for making electrical contact between the thin die and the substrate.

In another embodiment, the present invention may be characterized as a method for making a flip chip ball grid array package that includes the steps of reducing the thickness of a die from a wafer thickness to make a thin die; forming a plurality of thin film layers on the thin die surrounding vias wherein each thin film layer has a coefficient of thermal expansion that is greater than that of the thin die and is less than that of a substrate; forming a plurality of wafer bumps on the vias to make electrical contact with the thin die; and bonding the thin die to the substrate to make electrical contact between the wafer bumps and the substrate.

In yet another embodiment, the present invention may be characterized as a method for making a flip chip ball grid array package that includes the steps of reducing the thickness of a die from a wafer thickness to make a thin die; forming a plurality of wafer bumps on the thin die; forming a plurality of thin film layers on a substrate surrounding each of a plurality of contact pads on the substrate wherein each of the plurality of thin film layers has a coefficient of thermal expansion that is greater than that of the thin die and is less than that of the substrate; and bonding the thin die to the substrate to make electrical contact between the plurality of wafer bumps on the thin die and the plurality of contact pads on the substrate respectively.

The features and advantages summarized above in addition to other aspects of the present invention will become more apparent from the description, presented in conjunction with the following drawings.

BRIEF DESCRIPTION OF THE DRAWINGS

The above and other aspects, features and advantages of the present invention will be more apparent from the following more specific description thereof, presented in conjunction with the following drawings wherein:

FIG. 1 is a side view diagram of a flip chip ball grid array package of the prior art;

FIG. 2 is a side view diagram of a flip chip ball grid array package according to an embodiment of the present invention;

FIG. 3 is a flow chart of a method for making the flip chip ball grid array package of FIG. 2;

FIG. 4 is a side view diagram of a flip chip ball grid array package according to another embodiment of the present invention;

FIG. 5 is a side view of a portion of the flip chip ball grid array package of FIG. 4 before bonding;

FIG. 6 is a side view of the portion of the flip chip ball grid array package of FIG. 4 after bonding;

FIGS. 7 and 8 are side views of a portion of the flip chip ball grid array package of FIG. 2; and FIG. 9 is a flow chart of a method for making the flip chip ball grid array package of FIG. 4 according to a further embodiment of the invention.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 2 is a side view diagram of a flip chip ball grid array (BGA) package 200. Shown are a laminated substrate 108, wafer bumps. 110, solder balls 116, a thin die 202, an underfill 212, and thin film layers 230, 232, and 234.

The thin die 202 is so named to emphasize the fact that it is advantageously thinned to a selected thickness of about 127 microns to about 381 microns, i.e., about one-sixth to one-half the standard die thickness, to reduce mismatch of coefficient of thermal expansion (CTE) with the laminated-substrate 108. The thin die 202 is formed by backlapping or plasma etching the back side of a standard wafer die to reduce the wafer thickness to the desired thickness. The standard die thickness is determined by the limitations of the wafer fabrication process. The larger the wafer, the greater the wafer warpage, which requires a greater thickness to withstand the fabrication process. For example, a wafer size of 15.24 cm requires a thickness of about 625 microns, a wafer size of 20.32 cm requires wafer thickness of about 725 microns, and a wafer size of 30.48 cm will require an even greater thickness. Once the wafer is diced, however, the thickness required to support the wafer is no longer needed. An upper bound for the thickness of the thin die 202 is only 500 microns, clearly distinguishing it from the standard thickness of at least 625 microns. The reduced thickness gives the thin die 202 a higher tolerance to stress from the interface of the underfill 212 with the laminated substrate 108, making the solder joints of the ball grid array package 20 more reliable than that of FIG. 1. The thin die 202 is also less susceptible to flexure damage, reducing the likelihood of cracking.

The thin film layers 230, 232, and 234 are formed successively on the thin die 202 by, for example, spin coating. The thickness of each of the thin film layers 230, 232, and 234 is determined based on the manufacturing capability, the coefficient of thermal expansion of each layer, and the desired composite coefficient of thermal expansion, which in this case is that of the substrate. Each of the thin film layers 230, 232, and 234 is preferably made of an adhesive material having a coefficient of thermal expansion successively graduated from about 7–10 parts per million per degree Kelvin for the top thin layer 230, 10–14 parts per million per degree Kelvin for the middle thin layer 232, and 15–19 parts per million per degree Kelvin for the bottom thin layer 234. By way of example, polymers may be tailored to meet different coefficient of thermal expansion requirements by using different chemistry and fillers according to well known techniques.

The coefficient of thermal expansion of the thin die 202, about 3.5 parts per million per degree Kelvin, is matched to the coefficient of thermal expansion of the top thin film layer 230, the coefficient of thermal expansion of the top thin film layer 230 is closely matched within two to five parts per million per degree Kelvin to that of the middle thin film layer 232, the coefficient of the middle thin film layer 232 is likewise matched to that of the bottom thin film layer 234, and the coefficient of thermal expansion of the bottom thin film layer 234 is likewise matched to that of the laminated substrate 108. The combination of the thin die 202 with the thin film layers 230, 232, and 234 has a composite coefficient of thermal expansion of about 15–19 parts per million per degree Kelvin that reduces mismatch of coefficient of thermal expansion of the thin die 202 with the laminated substrate 108 from a factor of nearly ten to only two. In this example, three thin film layers are formed, however, a different number of thin layers may be formed to suit specific applications.

Electrical contact between the wafer bumps 110 and the thin die 202 may be made through the thin film layers 230, 232, and 234 as illustrated in FIGS. 7 and 8. Micro-vias 702 may be formed in the thin film layers 230, 232, and 234 according to well known techniques to connect wafer bumps 110 to the thin die 202 for various distributions of circuitry within the thin die 202.

The laminated substrate 108 is underfilled between the thin film layer 234 and the laminated substrate 108 by the underfill 212. The underfill 212 has a high tensile modulus that stiffens the ball grid array package 20 to further protect the thin die 202 from flexure damage. The underfill 212 may be, for example, a commercially available epoxy polymer such as Dexter FP4511 and FP4526.

FIG. 3 is a flow chart 300 for a method of making the flip chip ball grid array package of FIG. 2. At step 302, a die is thinned to make a thin die having a thickness reduced from a wafer thickness to reduce mismatch of a coefficient of thermal expansion with a laminated substrate. At step 304, thin film layers each having a coefficient of thermal expansion greater than that of the thin die and less than that of the laminated substrate are formed successively on the thin die around micro-vias. At step 306, wafer bumps are formed on the micro-vias to make electrical contact with the thin die. At step 308, the thin die is bonded to the laminated substrate. At step 310, an underfill epoxy is applied to fill in between the thin film layers and the laminated substrate.

FIG. 4 is a side view diagram of an alternative flip chip ball grid array package 400. Shown are a laminated substrate 108, eutectic solder wafer bumps 110, solder balls 116, a thin die 202, and thin film layers 230, 232, and 234. In this example, the wafer bumps 110 are formed on the thin die 202, and the thin film layers 230, 232, and 234 are formed directly on the laminated substrate 108 without underfilling. In other respects, the package of FIG. 4 is similar to the package of FIG. 2.

FIG. 5 is a side view of a portion of the flip chip ball grid array package 400 of FIG. 4 before bonding. Shown are the laminated substrate 108, the thin die 202, the thin film layers 230, 232, and 234, and contact pads 502 on the laminated substrate 108. The thin film layers 230, 232, and 234 may be patterned by, for example, photo-imaging techniques to leave spaces for the wafer bumps 110.

FIG. 6 is a side view of the portion of the flip chip ball grid array package 400 in FIG. 5 after bonding. The thin die 202 is electrically connected to contact pads 502 on the laminated substrate 108 by the eutectic solder wafer bumps 110.

Eliminating the step of underfilling simplifies the manufacturing process and avoids problems of air bubbles in the underfill that propagate bump cracks and flux contamination of the underfill material. Assembly cycle time and materials cost are therefore reduced, reducing overall cost of the flip chip ball grid array package.

FIG. 9 is a flow chart 900 of a method for making the flip chip ball grid array package of FIG. 4. At step 902, a die is thinned to make a thin die having a thickness reduced from a wafer thickness to reduce mismatch of a coefficient of thermal expansion with a laminated substrate. At step 904, thin film layers each having a coefficient of thermal expansion greater than that of the thin die and less than that of the laminated substrate are formed successively on the laminated substrate around contact pads on the laminated substrate. At step 906, wafer bumps are formed on the thin die. At step 908, the thin die is bonded to the laminated substrate to make electrical contact between the wafer bumps and the contact pads.

Other modifications, variations, and arrangements of the present invention may be made in accordance with the above teachings other than as specifically described to practice the invention within the scope of the following claims.

What is claimed is:

1. A method for making a flip chip ball grid array package comprising the following steps:

reducing the thickness of a die from a wafer thickness to a selected thickness to make a thin die for reducing mismatch of a coefficient of thermal expansion of the thin die to that of a substrate;

forming a plurality of thin film layers on the thin die wherein each of the thin film layers has a coefficient of thermal expansion that is greater than that of the thin die and is less than that of the substrate; and forming a plurality of wafer bumps on the thin die to make electrical contact between the thin die and the substrate.

2. The method of claim 1 wherein the die thickness is less than 500 microns.

3. The method of claim 1 wherein at least one of the plurality of thin film layers comprises an adhesive.

4. A method for making a flip chip ball grid array package comprising the following steps:

reducing the thickness of a die from a wafer thickness to a selected thickness to make a thin die for reducing mismatch of a coefficient of thermal expansion of the thin die to that of a substrate;

forming a plurality of thin film layers on the thin die wherein each of the thin film layers has a coefficient of thermal expansion that is greater than that of the thin die and is less than that of the substrate; and forming a plurality of wafer bumps on the thin die to make electrical contact between the thin die and the substrate wherein the plurality of thin film layers comprises a first, a second, and a third thin film layer having successively graduated coefficients of thermal expansion from about 7–10 parts per million per degree Kelvin for the first thin film layer, 10–14 parts per million per degree Kelvin for the second thin film layer, and 15–19 parts per million per degree Kelvin for the third thin film layer, respectively.

5. The method of claim 1 further including the step of underfilling between the thin die and the substrate.

6. A method for making a flip chip ball grid array package comprising the following steps:

reducing the thickness of a die from a wafer thickness to a selected thickness to make a thin die for reducing mismatch of a coefficient of thermal expansion of the thin die to that of a substrate;

forming a plurality of thin film layers on the thin die wherein each of the thin film layers has a coefficient of thermal expansion that is greater than that of the thin die and is less than that of the substrate; and bonding the thin die to the substrate to make electrical contact between the plurality of wafer bumps on the thin die and a plurality of contact pads on the substrate.

7. The method of claim 6 wherein the die thickness is less than 500 microns.

8. The method of claim 6 wherein at least one of the plurality of thin film layers comprises an adhesive.

9. A method for making a flip chip ball grid array package comprising the following steps:

reducing the thickness of a die from a wafer thickness to a selected thickness to make a thin die for reducing mismatch of a coefficient of thermal expansion of the thin die to that of a substrate;

forming a plurality of thin film layers on the thin die wherein each of the thin film layers has a coefficient of thermal expansion that is greater than that of the thin die and is less than that of the substrate; and bonding the thin die to the substrate to make electrical contact between the plurality of wafer bumps on the thin die and a plurality of contact pads on the substrate wherein the plurality of thin film layers comprises a first, a second, and a third thin film layer having successively graduated coefficients of thermal expansion from about 7–10 parts per million per degree Kelvin for the first thin film layer, 10–14 parts per million per degree Kelvin for the second thin film layer, and 15–19 parts per million per degree Kelvin for the third thin film layer, respectively.

* * * * *